(12) United States Patent
Tanikuni et al.

(10) Patent No.: US 7,393,433 B2
(45) Date of Patent: Jul. 1, 2008

(54) PLASMA PROCESSING APPARATUS, SEMICONDUCTOR MANUFACTURING APPARATUS AND ELECTROSTATIC CHUCKING UNIT USED THEREOF

(75) Inventors: Takamasa Tanikuni, Kawasaki (JP); Yasuhide Den, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 414 days.

(21) Appl. No.: 11/064,817

(22) Filed: Feb. 25, 2005

(65) Prior Publication Data
US 2005/0183828 A1    Aug. 25, 2005

(30) Foreign Application Priority Data
Feb. 25, 2004 (JP) ............... 2004-050118

(51) Int. Cl.
| | |
|---|---|
| C23C 16/00 | (2006.01) |
| C23F 1/00 | (2006.01) |
| H01L 21/306 | (2006.01) |
| H01L 21/683 | (2006.01) |
| B23B 5/22 | (2006.01) |
| B25G 3/22 | (2006.01) |
| H01T 23/00 | (2006.01) |

(52) U.S. Cl. .......... 156/345.51; 118/728; 118/729; 118/730; 156/345.52; 156/345.53; 156/345.54; 156/345.55; 361/234; 279/128

(58) Field of Classification Search .......... 118/728; 156/345.51; 361/234; 279/128
See application file for complete search history.

(56) References Cited

U.S. PATENT DOCUMENTS

| | | | | |
|---|---|---|---|---|
| 6,219,219 B1 * | 4/2001 | Hausmann et al. | .......... | 361/234 |
| 6,267,839 B1 * | 7/2001 | Shamouilian et al. | .. | 156/345.51 |
| 6,494,958 B1 * | 12/2002 | Shamouilian et al. | ....... | 118/728 |
| 6,616,767 B2 * | 9/2003 | Zhao et al. | ............. | 219/121.52 |
| 6,620,290 B2 * | 9/2003 | Yamamoto et al. | ..... | 156/345.41 |
| 2003/0079983 A1 * | 5/2003 | Long et al. | .................. | 204/164 |
| 2004/0245935 A1 | 12/2004 | Takayama et al. | | |

FOREIGN PATENT DOCUMENTS

| | | |
|---|---|---|
| JP | 10-242244 | 9/1998 |
| JP | 2003-160138 | 6/2003 |

* cited by examiner

Primary Examiner—Parviz Hassanzadeh
Assistant Examiner—Rakesh K Dhingra
(74) Attorney, Agent, or Firm—Young & Thompson

(57) ABSTRACT

A wiring member which becomes substantially symmetrical on the plane of an electrostatic chuck unit is connected to the tip end of an RF introduction rod between the RF introduction rod and the electrostatic chuck unit in order to make uniform generation of an electric field due to bias RF which becomes a cause of plasma damage. The connection point between the electrostatic chuck unit and the wiring member may be single or plural.

6 Claims, 10 Drawing Sheets

PLASMA PROCESSING APPARATUS, SEMICONDUCTOR MANUFACTURING APPARATUS AND ELECTROSTATIC CHUCKING UNIT USED THEREOF

BACKGROUND ART OF THE INVENTION

1. Technical Field

The present invention relates to a plasma processing apparatus for processing an object to be treated, in particular a semiconductor wafer or a substrate for liquid crystal, a semiconductor manufacturing apparatus such as a high-density plasma (HDP) CVD apparatus, and an electrostatic chucking unit used for the corresponding semiconductor manufacturing apparatus.

2. Related Arts

Generally, a plasma etching apparatus, plasma CVD apparatus, ion implantation apparatus, sputtering apparatus, etc., are available as a plasma processing apparatus used for manufacturing semiconductor devices, liquid crystal display devices, etc. A high-density plasma (HDP)-CVD apparatus, which carries out CVD (chemical vapor deposition) by generating high-concentration plasma, of these plasma processing apparatuses is used for forming an interlayer insulation film, trench embedding film, or passivation film in a semiconductor apparatus.

Conventionally, this type of HDP-CVD apparatus is provided with a vacuum chamber into which a processing gas can be introduced and from which the inner gas can be discharged, and an RF coil disposed so as to surround the vacuum chamber. By driving the RF coil by an RF power source, high-density plasma is generated in the vacuum chamber. There may be cases where an electrostatic chucking unit (ESC) that electrostatically supports and fixes a semiconductor wafer, etc., which is an object to be treated, is disposed in the vacuum chamber of the HDP-CVD apparatus.

In Japanese Unexamined Patent Publication No. Hei-10-242244 (1st prior art), an HDP-CVD apparatus equipped with an electrostatic chucking unit (ESC) is disclosed. The HDP-CVD apparatus disclosed in the first prior art has a unipolar electrostatic chuck unit for attracting a semiconductor wafer or other substrate onto a surface of the dielectric film coated on the chuck unit by means of electrostatic attraction of an inductive charge. Where the electrostatic chuck unit is used, it is possible to dispose and treat two wafer sheets thereon. In detail, the electrostatic chuck unit disclosed in the first prior art is provided with a cylindrical chuck body formed of a dielectric and a dielectric layer formed on two circular regions of the chuck body opposed to each other. Also, at the same time, a water-cooling channel for cooling the chuck body itself and a helium channel for cooling the wafer are provided in the chuck body. Further, the chuck body is connected to a bias RF source by a power source line, and bias RF voltage is applied to the chuck body through the power source line, where charge plasma is generated in a processing area, and a wafer is electrostatically attracted onto and fixed on the chuck surface with electrostatic attraction of an inductive charge based on the charge plasma.

On the other hand, in the specification of Japanese Unexamined Patent Publication No. 2003-160138 (2nd prior art), an HDP-CVD apparatus is shown, which has an electrostatic chuck unit in the vacuum chamber thereof. The electrostatic chuck unit shown in the second prior art is provided with an ESC (electrostatic chuck structure) stage, an RF introducing rod, connected to the stage and the bias RF power source, which supplies bias RF from the bias RF power source to the ESC stage, and a bias RF wiring, extending from the RF introducting rod, which is connected to the ESC stage. In addition, where plasma processing is carried out by generating high-power and high-density plasma using the electrostatic chuck of the second prior art, it has been pointed out that unfavorable damage occurs in a substrate to be plasma-treated, for example, a semiconductor wafer, and as a result, product yield is remarkably lowered.

Herein, a detailed description is given with the HDP-CVD apparatus shown in the second prior art with reference to drawings. Referring to FIG. 1 and FIG. 2, the HDP-CVD apparatus shown therein is a processing portion of a cluster type vacuum processing apparatus. The processing portion has a vacuum chamber 10, and the vacuum chamber 10 has a ceramic dome 11 with an opening at its top and a channel body (lower chamber) 12 connected to the dome 11. The dome 11 and the channel body 12 define the interior space of the vacuum chamber 10.

A top coil 15 is disposed on the top of the dome 11. On the other hand, a side RF coil 16 is disposed sideways of the dome 11. Further, a side nozzle 18 for jetting a gas to the side of the dome 11 is provided inside the dome 11. With such a construction, plasma generating space is provided at the upper part of the dome 11, and processing space is provided at the lower part of the dome 11.

As illustrated, a ceramic plate (herein, AlN plate) 26, a heater plate 28 and a cooling plate 30 are laminated in this order and provided on the top coil 15 secured at the top portion of the dome 11. Also, a nozzle 32 is provided so as to protrude inside the dome 11 at the middle part of the top portion of the dome 11, and the nozzle 32 is connected to the top $O_2$ line and top silane line, which extend through an opening formed between the cooling plate 30, heater plate 28 and ceramic plate 26. Also, the dome 11 and the entire members incidental thereto are enclosed by a lid cover 35. Further, the top coil 15 and side coil 16 are connected to the RF power source 36, and a source RF voltage is applied from the RF power source 36 to these coils 15 and 16.

On the other hand, a turbo pump 22 for exhausting air from the vacuum chamber 10 is connected to the bottom of the channel body (lower chamber) 12 via a slot valve 20 and a gate valve 21. In addition, a slit valve 24 and a remote plasma generator (applicator) 27 are provided at the side portion of the channel body 12.

Furthermore, a cathode body 40 for supporting and fixing an object to be processed (herein, a semiconductor wafer) is disposed in the processing space defined by the channel body 12 so as to be opposed to the top nozzle 32, and an electrostatic chuck unit 44 is installed in the processing space between the cathode body 40 and the side nozzle 18.

The electrostatic chuck unit 44 illustrated is electrically connected to the bias RF power source 42 secured outside the vacuum chamber 10, and a bias RF voltage of 13.56 kHz is supplied from the bias RF power source 42 to the electrostatic chuck unit 44 via a power supply shaft, that is, the RF introduction rod 46.

Herein, the electrostatic chuck unit 44 includes a supporting member 441 formed by a dielectric for supporting a substrate such as a semiconductor wafer and a conductive member 442 formed by a conductive material such as aluminum, and the conductive member 442 is connected to the RF introduction rod 46 via a wiring member 443. A combination of the electrostatic chuck unit 44, wiring member 443 and RF introduction rod 46 is herein called as an "electrostatic chuck member."

In the HDP-CVD apparatus thus constructed, when a bias RF voltage is supplied from the bias RF power source 42, charge plasma is generated, and the semiconductor wafer is electrostatically attracted on the upper surface of the electrostatic chuck by electrostatic attraction based on an inductive charge by the charge plasma and is fixed thereat.

Here, with reference to FIG. 2, a further detailed description is given of a construction of the electrostatic chuck unit 44 that composes the cathode body 40 used for a prior art plasma processing apparatus. FIG. 2 shows a connection between the electrostatic chuck unit 44 and the RF introduction rod 46 when the electrostatic chuck unit 44 is observed from the rear side of the cathode body 40. As illustrated, the RF introduction rod 46 is connected, at one point, to the conductive member 442 of the electrostatic chuck unit 44 by the wiring member 443.

However, the first prior art discloses only an electrostatic chuck unit having two electrostatic chucking surfaces and capable of processing two wafer sheets. It does not disclose any connection position, etc., between the electrostatic chuck unit and a power source line. Therefore, in the first prior art, no consideration is taken of distortion of an electromagnetic field based on an application position of the electrostatic chuck unit, to which a bias RF voltage is applied from the bias RF source, and influences thereof.

On the other hand, it has been pointed out, in the second prior art, that the electric field in the vacuum chamber is locally increased due to overlapping of the electric field based on the source RF output portion and the electric field generated in the application position of the bias RF in the ESC stage, whereby plasma is biased, and plasma damage is produced at a partial area of silicon wafer. Taking the same into consideration, the second prior art discloses that it is possible to mitigate plasma damage in wafer by determining the application position of the bias RF in the ESC stage at a position apart from the electric field based on the source RF output portion (that is, a position as far from the RF introduction rod as possible).

However, the second prior art only points out alternation of the positions of the source RF output portion and the bias RF application point. The second prior art does not disclose any means for making uniform the electric field inside the ESC stage.

Further, according to experiments made by the present inventor, as in the second prior art, it is made clear that only alteration of the connection position of the bias RF wiring connected to the RF introduction rod is insufficient to make distribution of the electric field in the vacuum chamber uniform.

Next, it is confirmed that, where, using a HDP-CVD apparatus shown in FIG. 1 and FIG. 2, a MOS transistor is produced on a semiconductor wafer incorporated in the electrostatic chuck unit 44, plasma damage is intensively generated at the connection part between the wiring member 443 for introducing bias RF and the electrostatic chuck unit 44, and in the vicinity thereof.

To make this clear, a description is given of the results of experiments in the case where a prior art plasma processing apparatus was used. First, a method for evaluating gate breakdown voltage using an antenna ratio has been known as a technology for evaluating plasma damage in a CVD apparatus. Herein, the antenna ratio expresses the ratio (SH/SG) of the area (SG) of a gate electrode of a MOS transistor formed as a device and the area (SH) of wiring connected to the gate electrode. Since the larger the antenna ratio becomes, the wider the area exposed to plasma becomes, deterioration of the gate breakdown voltage becomes remarkable. In addition, in a case of a device having a fixed antenna ratio, the higher the intensity of plasma is, the greater the deterioration of the gate breakdown voltage of the device becomes.

Using such an evaluation method, the gate breakdown voltage of the MOS transistor in a semiconductor wafer manufactured by a prior art HDP-CVD apparatus shown in FIG. 1 and FIG. 2 was evaluated, and the results shown in FIG. 3 were obtained. FIG. 3 shows the positions of the chips in the wafer which are subjected to plasma damage. For example, ■ shows the chip which is subjected to plasma damage and whose breakdown voltage is 5 kV or low. In FIG. 3, the number of chips of ■ is 17. Also, the number of chips whose breakdown voltage is 6.2 kV or low and larger than 6 is 36, for example.

As shown in FIG. 3, it has been found that, even in a case where the antenna ratio is comparatively small, for example, antenna ratio=5K, a number of chips which are subjected to plasma damage were produced, and the number of chips which are subjected to plasma damage was increased as the antenna ratio becomes larger and larger for 20K, 45K and 125K. Also, it is found that, where the connection position of the RF introduction rod 46 shown in FIG. 2 is taken into consideration, chips in which plasma damage occurred were unevenly generated at the connection position side by the wiring member 443 between the electrostatic chuck unit 44 and RF introduction rod 46. It can be presumed that this situation occurred due to strain in the electric field generated when closing the bias RF power source 42.

SUMMARY OF THE INVENTION

According to a first aspect of the present invention, there is provided a plasma processing apparatus including an electrostatic chuck unit for electrostatically supporting and fixing an object to be processed, and a bias introducing rod for applying bias of an RF frequency to the electrostatic chuck unit, thereby plasma-processing an object to be processed, and a wiring member electrically connected to the bias introduction rod and taken out with spacing remaining with respect to the plane of the electrostatic chuck unit. The wiring member is taken out so as to be substantially symmetrical on the plane when the wiring member is projected on the plane of the electrostatic chuck unit.

In this case, the electrostatic chuck unit includes a supporting member for defining a mounting plane of the object to be processed, and a conductive member secured on the rear side of the mounting plane of the supporting member (a dielectric plate), and the wiring member is electrically connected to the conductive member at least a part thereof.

In detail, the wiring member includes two wiring portions extending in directions different from each other from the end portion of the bias introduction rod. In this case, it is preferable that the respective wiring portions are provided with a copper or a copper alloy line and coated layer coating the copper or copper alloy line.

Further, it is preferable that the above-described two wiring portions include bent portions each extending in directions different from each other from the end portion of the bias introducing rod and curved portions connected to the other end portion of the corresponding bent portions. In this case, it is preferable that the two wiring portions are connected to the electrostatic chuck unit at respective end portions of the above curved portions and a plurality of connection points are disposed at a substantially centrosymmetrical position with respect to the center point of the circular-shaped electrostatic chuck unit.

According to a second aspect of the present invention, there is provided a semiconductor manufacturing apparatus including an electrostatic chuck unit for electrostatically supporting and fixing a semiconductor wafer, and a bias introduction rod for applying bias of an RF frequency to the electrostatic chuck unit, and being capable of processing the object to be processed. The semiconductor manufacturing apparatus has a wiring member electrically connected to the bias introducing rod and taken out with spacing remaining with respect to the plane of the electrostatic chuck unit. The wiring member is taken out so as to be substantially symmetrical on the plane when the wiring member is projected on the plane of the electrostatic chuck unit.

According to a third aspect of the present invention, there is provided an electrostatic chuck unit, for electrostatically supporting and fixing a semiconductor wafer, to which RF bias is applied, and which includes a supporting member for electrostatically supporting and fixing the semiconductor wafer and a bias introducing rod for applying bias of RF frequency to the supporting member. The electrostatic chuck unit has a wiring member electrically connected to the bias introduction rod and taken out with a spacing remaining with respect to the plane of the electrostatic chuck unit, and the wiring member is taken out so as to be substantially symmetrical on the plane when the wiring member is projected on the plane of the electrostatic chuck unit.

According to a fourth aspect of the present invention, there is provided a plasma processing apparatus having a supporting base for supporting an object to be processed and a bias introducing portion for applying bias to the corresponding supporting base. The plasma processing apparatus includes a wiring portion electrically connected to the bias introduction portion at the lower part of the supporting base. The wiring portion is featured in that the position projected onto the plane of the wiring portion which is parallel to the supporting base is roughly symmetrical to a specified portion in the area onto which the object to be processed is projected.

The present invention is provided with a supporting member of an electrostatic chuck unit disposed in a vacuum chamber, an RF introducing rod extending from the outside of the vacuum chamber into the interior thereof, and a wiring member in the vacuum chamber, wherein by making the wiring member substantially symmetrical with respect to the tip end of the RF introducing rod, the electric field in the vacuum chamber can be made uniform, and plasma damage produced in a wafer due to strains in the electric field at the beginning of bias RF application can be reduced. Resultantly, yield of devices can be improved.

DETAILED DESCRIPTION OF THE PREFERRED EMBODIMENTS

Figure 1:
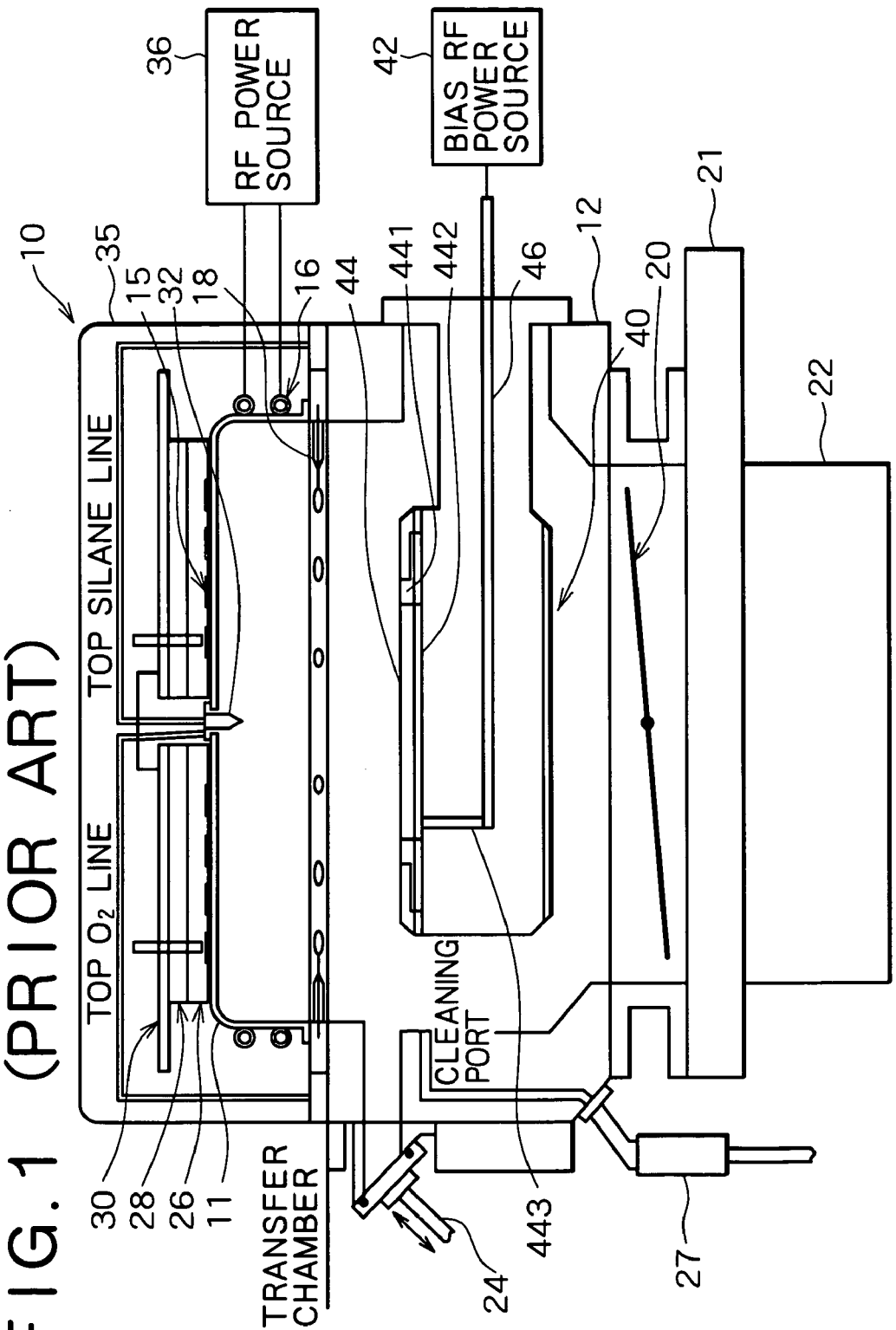
FIG. 1 is a sectional view showing a brief configuration of a prior art HDP-CVD apparatus.
Figure 2:
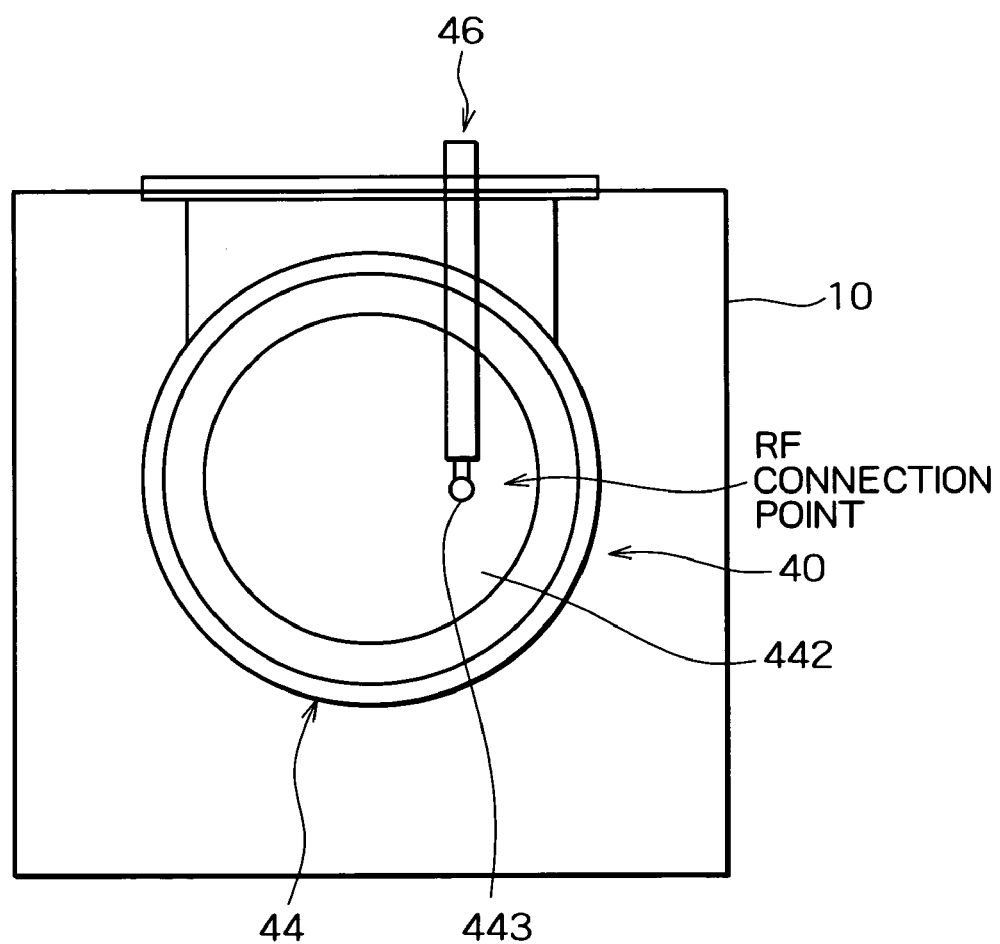
FIG. 2 is a plan view showing a connection relationship between an RF introduction rod and an electrostatic chuck unit of the apparatus shown in FIG. 1.

In the HDP-CVD apparatus shown in FIG. 1 and FIG. 2, the present inventors carried out experiments in which an electrostatic chuck unit 44 and a wiring member 443 are connected to each other in a plurality of positions and conducted an evaluation using antenna ratios. At this time, experiments and evaluation using the antenna ratio, which are similar to the above, were carried out while varying the shape of the wiring member 443 and simultaneously changing the number of connection positions between the electrostatic chuck unit 44 and the wiring member 443. As a result, it was found that the shape of the wiring member influences generation of plasma damage on a semiconductor wafer. In other words, it is found that, by shaping the wiring member so as to become substantially symmetrical to the RF introduction rod, asymmetry of the electric field by the bias RF can be improved, and influences due to plasma damage can be reduced. Further, such a finding could be obtained, that generation of plasma damage can be mitigated by increasing the number of connection points between the electrostatic chuck unit 44 and the wiring member 443. On the basis of the above-described finding, the present invention proposes a shape of the wiring member so that the electric fields resulting from the bias RF substantially becomes symmetrical. Further, in the present invention, it is proposed that the connection point between the corresponding wiring member and the electrostatic chuck unit be made into a plurality.

Figure 4:
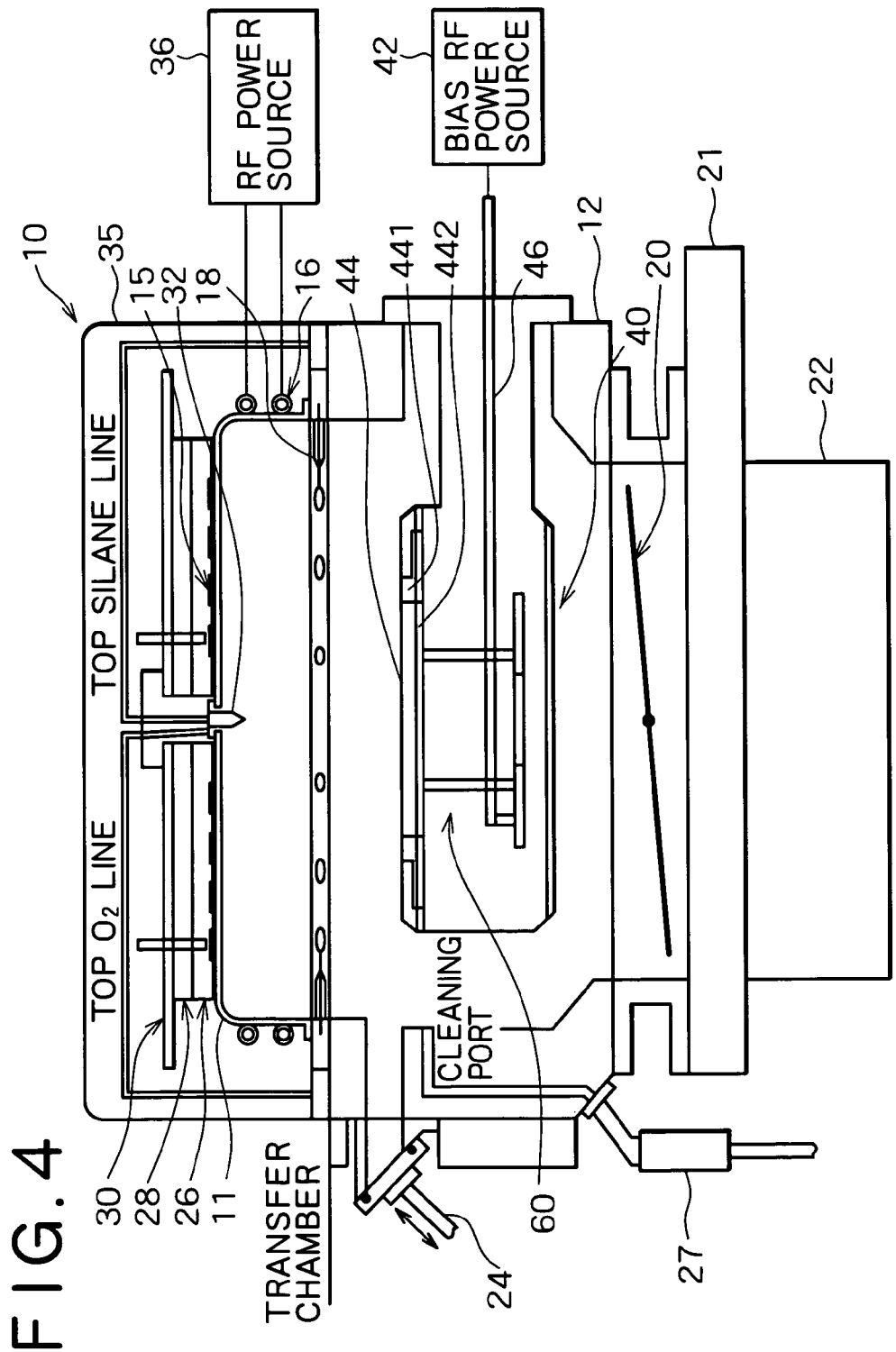
FIG. 4 is a sectional view briefly showing a manufacturing apparatus (herein, HDP-CVD apparatus) of a semiconductor device according to one embodiment of the present invention.

FIG. 4 shows a plasma processing apparatus according to one embodiment of the present invention. Herein, the embodiment shown in FIG. 4 is a case where the invention is applied to an HDP-CVD apparatus, as the prior art shown in FIG. 1. The same reference numerals are given to components of FIG. 4, which correspond to those shown in FIG. 1.

As has been shown in FIG. 4, the HDP-CVD apparatus according to the embodiment of the present invention is different from the conventional HDP-CVD apparatus shown in FIG. 1 in the construction of the wiring member 60 connected to the RF introduction rod 46. In detail, according to the present embodiment, the wiring member 60 which is disposed in the vacuum chamber 10 is electrically connected to the conductive member 442 of the electrostatic chuck unit 44 at a plurality of points, and at the same time, is electrically connected to the RF introduction rod 46. Although the wiring member 60 is disposed beneath the RF introduction rod 46 with respect to the electrostatic chuck unit 44, it may be disposed above the RF introduction rod 46 if any space is available. These electrostatic chuck unit 44, RF introduction rod 46 and wiring member 60 are aggregately called an "electrostatic chuck member."

Figure 5:
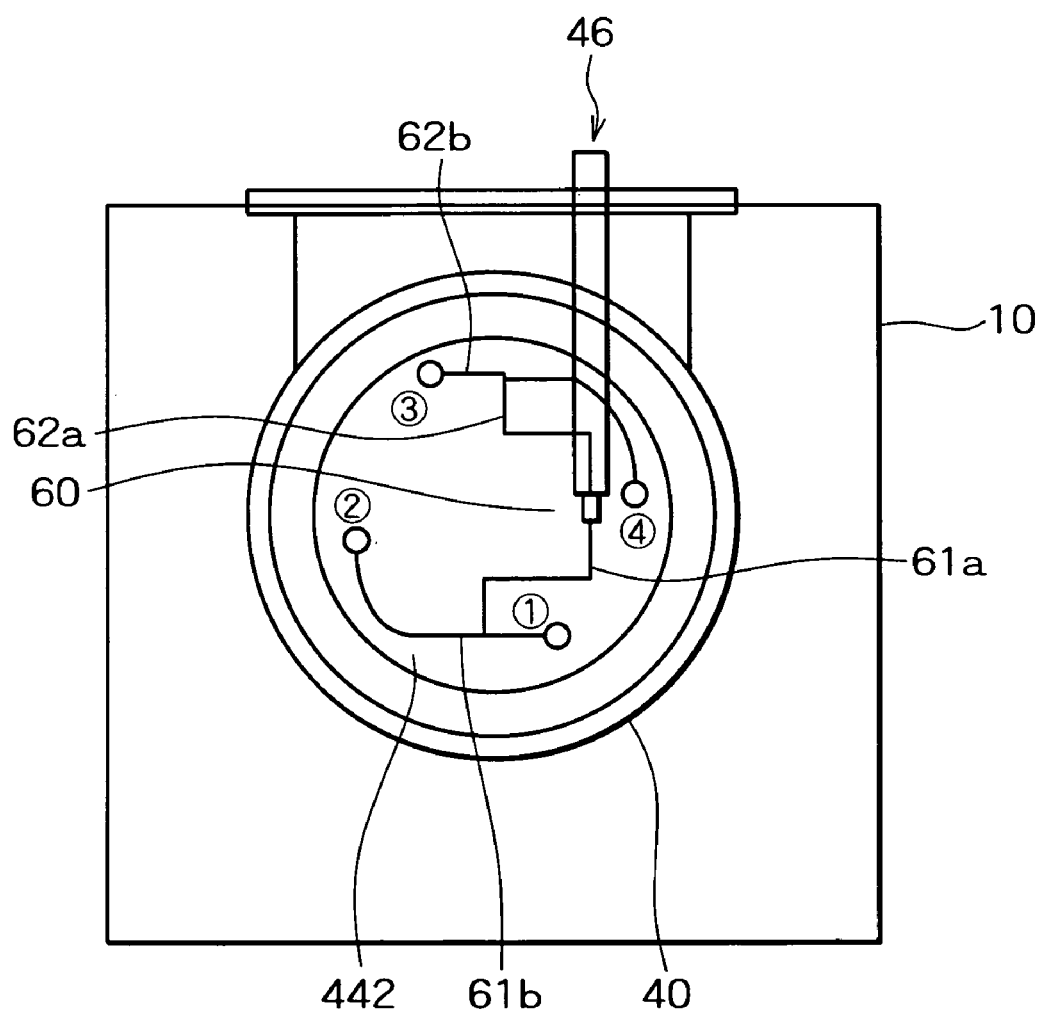
FIG. 5 is a plan view showing the relationship between an electrostatic chuck unit and a wiring member connected to the RF introduction rod in a manufacturing apparatus shown in FIG. 4.

Referring to FIG. 5, the wiring member 60 is connected to the disk-shaped conductive member 442 of the electrostatic chuck unit 44 at four connection points ①, ②, ③ and ④. Also, as has been seen in FIG. 5, the wiring member 60 includes the first wiring portion connected to the connection points ① and ② and the second wiring portion connected to the connection points ③ and ④. The first wiring portion is composed of a bent portion 61a connected to the RF introduction rod 46 and a curved portion 61b. Similarly, the second wiring portion is also composed of a bent portion 62a connected to the RF introduction rod 46 and a curved portion 62b.

The bent portions 61a and 62a of the wiring member 60 extend from the RF introduction rod 46 onto the conductive member 442 so that they become substantially linear-symmetrical to the straight line passing through the center of the disk-shaped conductive portion 442. On the other hand, the curved portions 61b and 62b extend from the bent portions 61a and 62a so as to become substantially centrosymmetrical to the center of the disk-shaped conductive portion 442, respectively. Thus, the combination of the bent portion 61a and curved portion 61b has such a shape as to become substantially symmetrical to the combination of the bent portion 62a and curved portion 62b with respect to the tip end portion of the RF introduction rod 46.

Further, since a circular-shaped semiconductor wafer is mounted on the supporting member 441 on the conductive member 442, the wiring member 60 extending from the tip end of the RF introduction rod 46 will have a portion which is linear-symmetrically and centrosymmetrically to the center of the semiconductor wafer.

Herein, "substantially symmetrically" means not only a case of having a shape having accurate symmetry but also a case of having a shape which can mitigate disorder in the electric field due to bias RF.

Generally speaking on the basis of the above description, it is understood that where a wiring member connected to the bias introduction rod 46 and taken out with spacing remaining with respect to the plane defined by the electrostatic chuck unit 44, that is, the wiring portion 60 is projected onto the plane of the electrostatic chuck unit 44, the wiring member (wiring portion 60) is taken out so as to be made into a substantially symmetrical shape on the above-described plane. In other words, the wiring portion electrically connected with the bias introduction portion (RF introduction rod 46) at the lower part of the supporting base such as the electrostatic chuck unit 44 has such a shape as the position at which the wiring portion is projected on the plane parallel to the supporting base becomes roughly symmetrical to a specified portion of an area onto which the object to be processed is projected. In the illustrated example, the specified portion is roughly the center point of the object to be processed or the centerline passing through the center point.

The bent portions 61a and 62a and curved portions 61b and 62b which compose the wiring member 60 are made of a copper cable and a coated layer of polytetrafluoroethylene (Brand name: Teflon (Registered trade mark)) for coating the copper cable, wherein the copper cable itself is not exposed.

In FIG. 5, it was described that, by disposing two wiring portions of the wiring member 60 so as to be substantially symmetrical with respect to the tip end of the RF introduction rod 46, influences of the plasma damage can be mitigated. Further, in FIG. 5, influences of plasma damage on the semiconductor wafer were evaluated using the antenna ratio by varying the number of connection points of the wiring member 60 with respect to the conductive member 442 of the electrostatic chuck unit 44. In detail, experiments and evaluation were carried out in states where the wiring member 60 is connected to or disconnected from the electrostatic chuck unit 44 at the positions ①, ②, ③ and ④ in FIG. 5.

Figure 3:
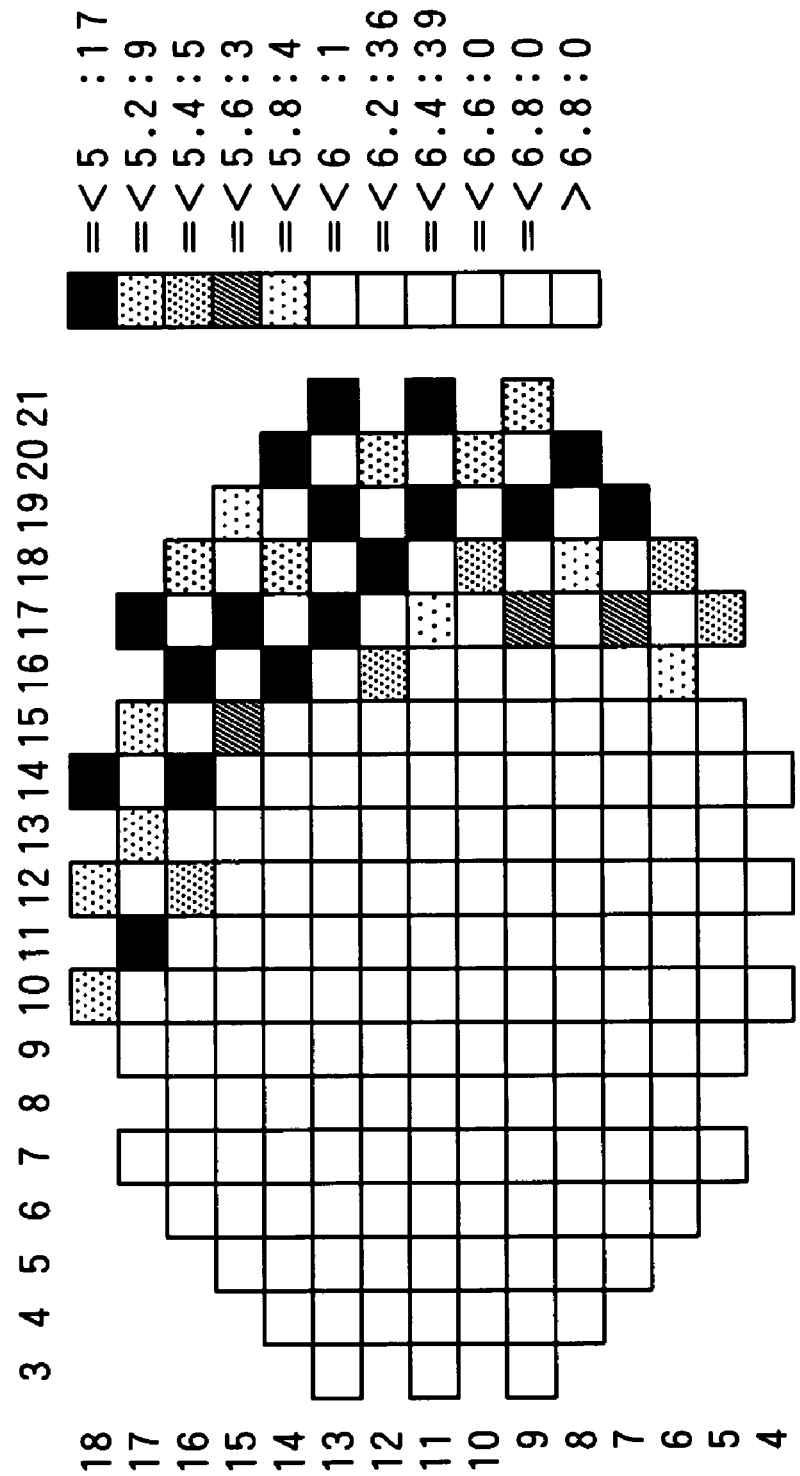
FIG. 3 is a view showing the experimental results in a case where a semiconductor wafer is processed by using the HDP-CVD device shown in FIG. 1 and FIG. 2.
Figure 6:
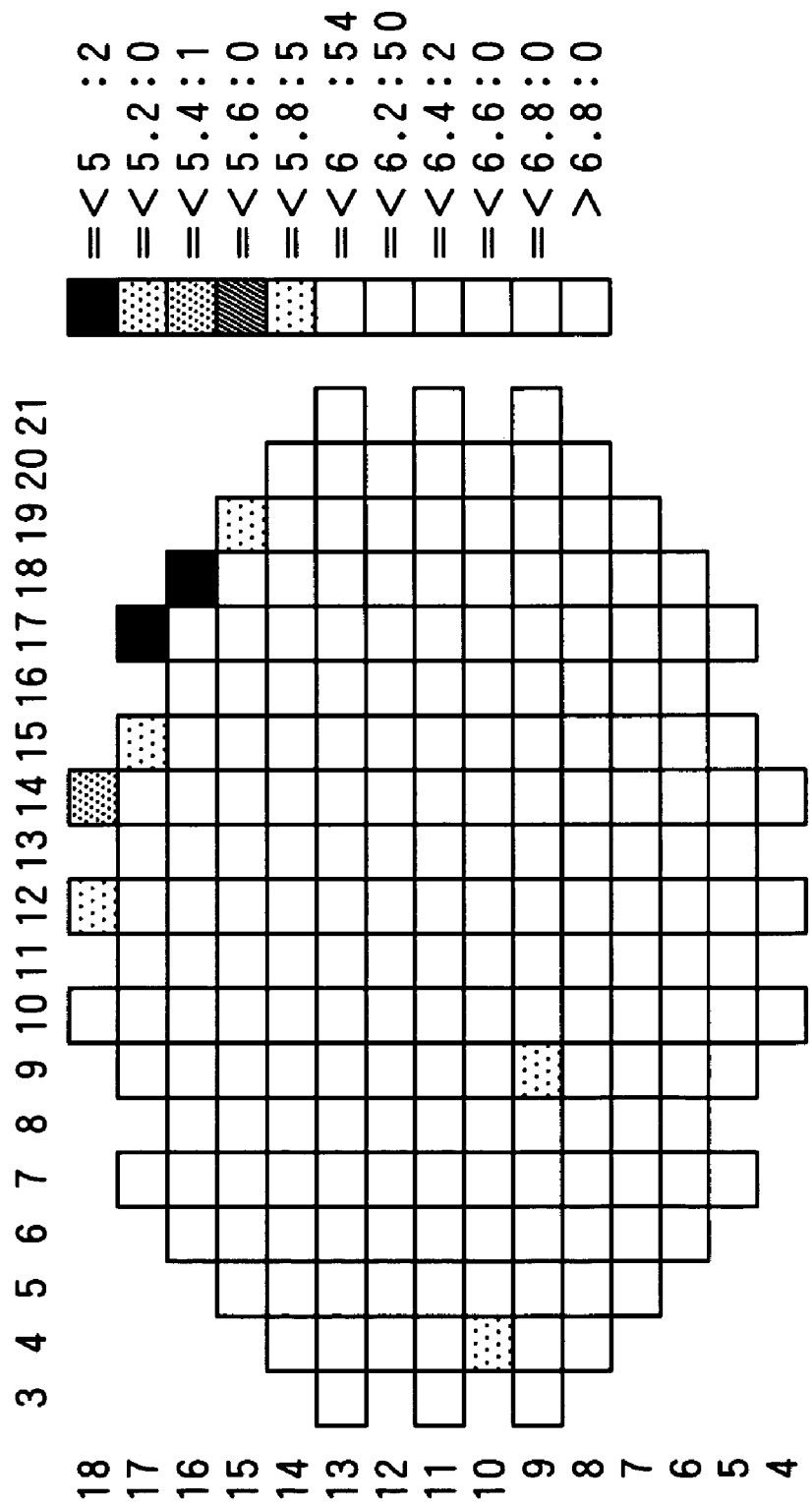
FIG. 6 is a view showing one example of the experimental results using the wiring member shown in FIG. 5.

FIG. 6 shows the results of experiments in cases where the wiring member 60 having a symmetrical pattern shown in FIG. 5 is connected to the electrostatic chuck unit 44 (in detail, conductive member 442) at the positions (①, ②, ③ and ④). FIG. 6 shows a case where the antenna ratio is 5K, wherein it is understood that the number of chips, shown with black or gray, which are subjected to plasma damage becomes remarkably smaller than in the case of a prior art shown in FIG. 3. In addition, defective chips due to plasma damage were prevented from occurring at the tip end of the RF introducing rod 46. The tendency is secured even if the antenna ratio is increased to 20K, 45K and 125K, wherein no defective chips as shown in FIG. 3 are generated.

Figure 7:
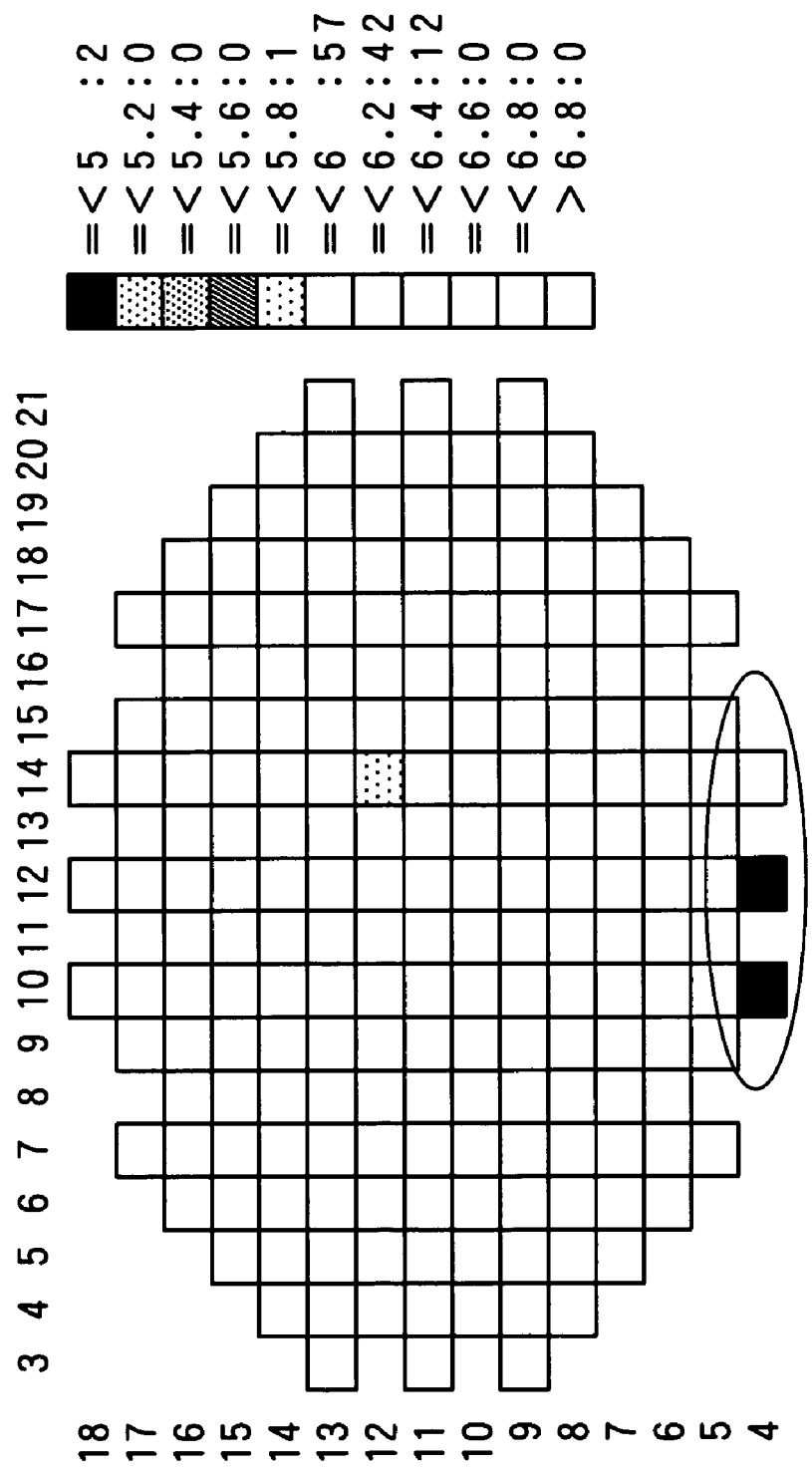
FIG. 7 is a view showing the results in a case where an experiment was carried out with the connection position of the wiring member shown in FIG. 5 changed from the connection position shown in FIG. 6.

Next, FIG. 7 shows the results of experiments in a case where the wiring member 60 shown in FIG. 5 is connected to the electrostatic chuck unit 44 only at the position ②. Herein, the case where the antenna ratio is 5K is shown. In FIG. 7, chips which were subjected to plasma damage are shown with black as in FIG. 6. As shown in FIG. 7, defective chips shown with black exist only at the lower end of the semiconductor wafer, wherein it is found that the defective chips are resulted from the substrate. Therefore, in a case where the wiring member 60 is connected to the electrostatic chuck unit 44 only at the position ②, only defects resulting from the substrate are generated, wherein it is understood that the number of chips which are subjected to plasma damage can be remarkably made small, and yield thereof can be increased.

Figure 8:
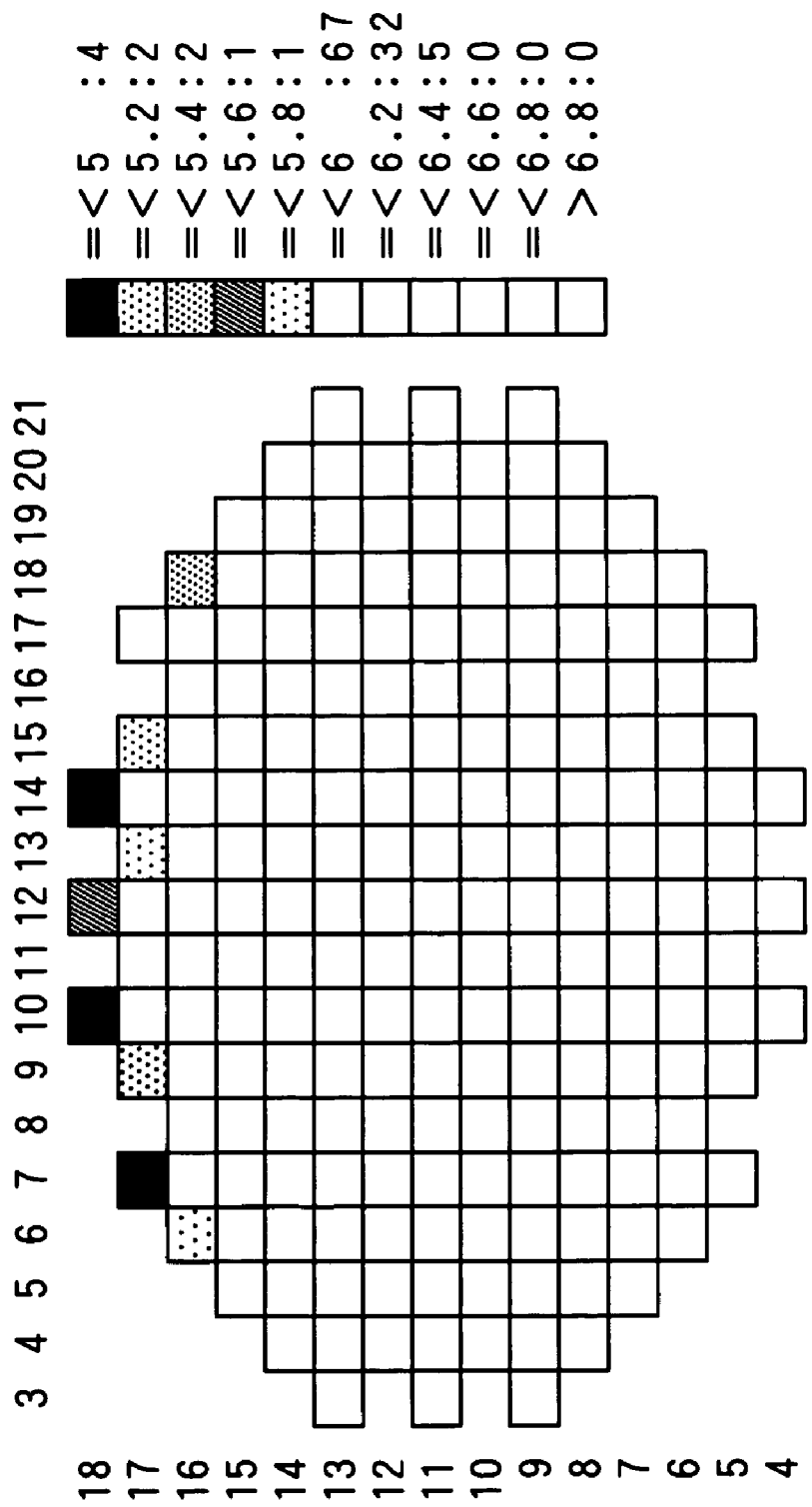
FIG. 8 is a view showing the results in a case where an experiment was carried out at a position where the connection position of the wiring member shown in FIG. 5 is further changed.

Further, FIG. 8 shows the results of experiments in which the wiring member 60 shown in FIG. 5 is connected to the electrostatic chuck unit 44 only at the position ③ and the antenna ratio is made into 5K. As has been made clear in FIG. 8, chips shown with black or gray, which are subjected to plasma damage, are limited to the upper part of the semiconductor wafer, wherein only by connecting the wiring member 60 having a symmetrical shape shown in FIG. 5 to the electrostatic chuck unit 44 only at the position ③, influences due to plasma damage can be mitigated in comparison to the prior art shown in FIG. 3, and therefore, yield of the chips can be improved.

Figure 9:
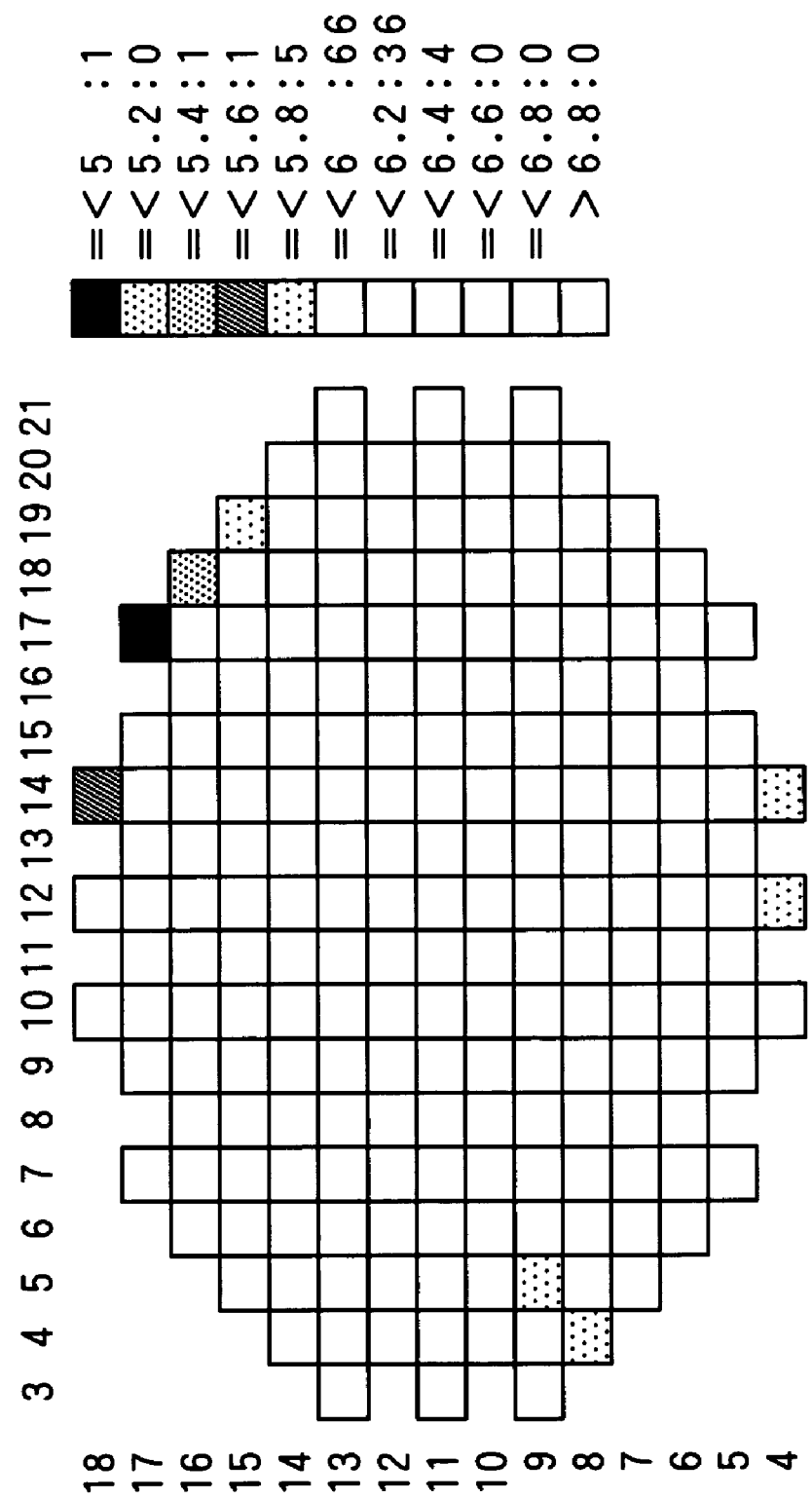
FIG. 9 is a view showing the results in a case where an experiment was carried out at another position where the connection position of the wiring member shown in FIG. 5 is changed.

FIG. 9 shows the results of experiments in which the wiring member 60 shown in FIG. 5 is connected to the electrostatic chuck unit 44 at two positions ③ and ④. Herein, the antenna ratio is 5K. As has been made clear in FIG. 9, chips shown with black or gray which are subjected to plasma damage are remarkably reduced, wherein yield of the chips can be further improved in comparison to the prior art shown in FIG. 3.

Figure 10:
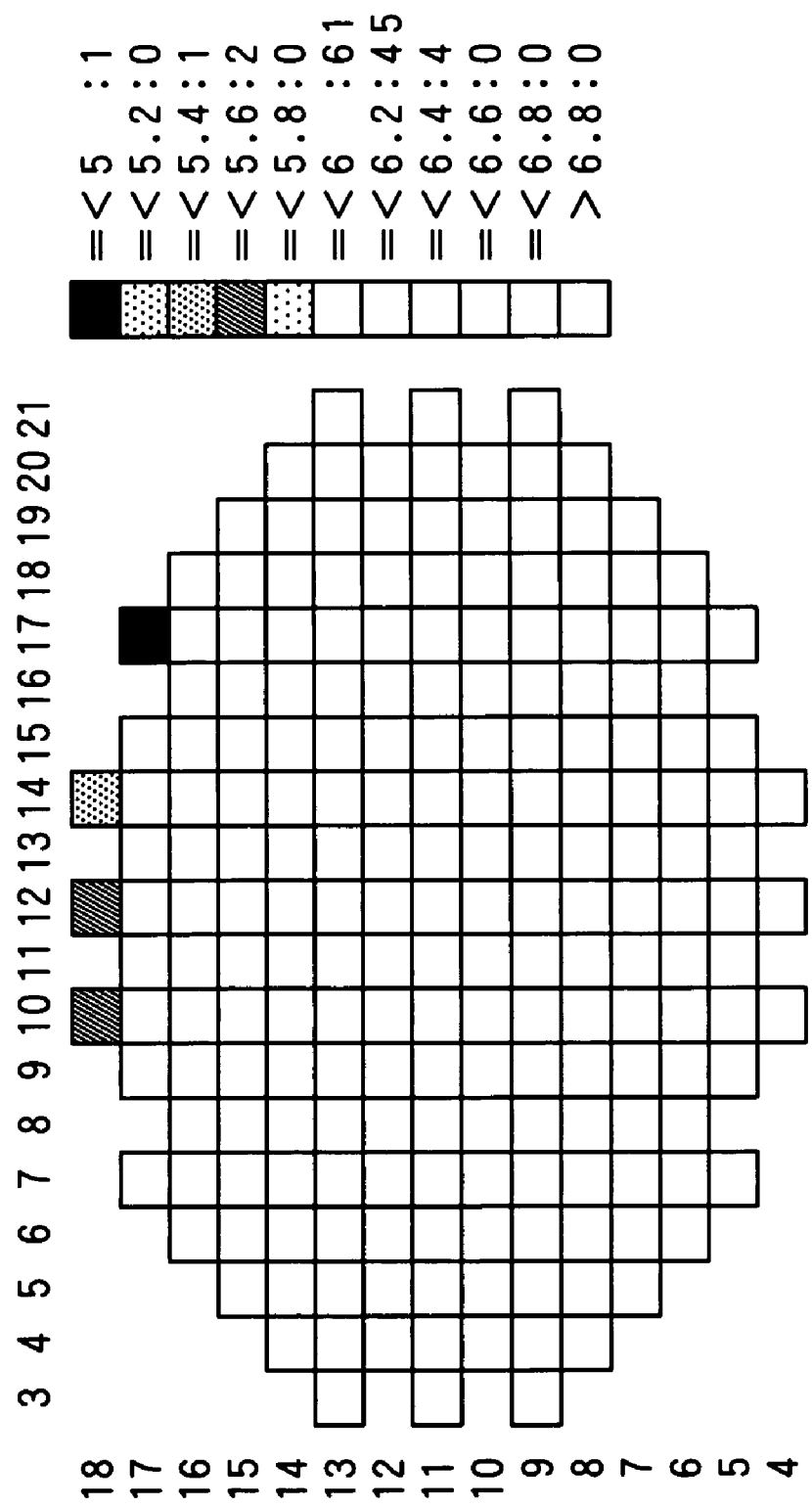
FIG. 10 is a view showing the results in a case where an experiment was carried out at a position where the connection position of the wiring member shown in FIG. 5 is changed.

FIG. 10 shows the results of experiments in which the wiring member 60 shown in FIG. 5 is connected to the electrostatic chuck unit 44 at the positions ② and ③ thereof, wherein the antenna ratio is 5K. As has been made clear in FIG. 10, chips shown with black or gray, which are subjected to plasma damage are limited in a remarkably limited area of the semiconductor wafer. Therefore, the number of chips which are subjected to plasma damage can be remarkably reduced in comparison to the prior art. Resultantly, yield thereof can be improved.

As has been made clear on the basis of the above experimental results, the wiring member 60 having two branch portions (61a and 61b: 62a and 62b) extending in parallel to the electrostatic chuck unit 44 and substantially symmetrically thereto is connected to the electrostatic chuck unit 44 at least at one position, whereby influences due to plasma damage can be remarkably mitigate, and yield of chips obtained from semiconductor wafer by an HDP-CVD apparatus can be improved.

In the above-noted embodiment, only the wiring portion formed of the bend portions 61a, 62a and curved portions 61b and 62b bifurcated into two from the tip end of the RF introduction rod 46 is shown as the wiring member 60. However, the present invention is not limited to the above construction. A wiring portion which maintains symmetry and has a greater number of bifurcated portions can be available. In addition, various types of wiring profiles such as a roughly circular shape, an oval shape, an elliptical shape, an eddy shape, etc., may be employed for the wiring member 60. Further, the number of connection positions of the wiring member 60 and electrostatic chuck unit 44 may be optionally increased and decreased.

The present invention is applicable to a manufacturing apparatus equipped with an electrostatic chuck unit as in a manufacturing apparatus of a semiconductor device such as an HDP-CVD apparatus. Also, it is a matter of course that the invention is applicable not only to the semiconductor device but also production of a liquid crystal display device, etc.

Further, a bias RF wiring equipped with a configuration according to the present invention can be applied to apparatuses other than the HDP-CVD apparatus.

What is claimed is:

1. A plasma processing apparatus, comprising:
    an electrostatic chuck having a conductive member that generates an electrostatic attraction for holding an object;
    an RF bias-introducing rod connected to a source of RF power; and
    a wiring member connecting said RF bias-introducing rod to said conductive member,
    in plan view, said wiring member having plural linear connectors and plural curved connectors, each of said linear connectors having one end connected to a same end of said RF bias-introducing rod and being substantially linear-symmetrical with respect to a straight line passing through a center of said conductive member, each of said curved connectors being substantially centrosymmetrical with respect to the center of said conductive member and having two distal ends and being connected to an opposite end of a respective different one of said linear connectors, and
    at least one of the distal ends of one of said curved connectors being connected to said conductive member.

2. The apparatus of claim 1, wherein all of said plural linear connectors are connected to only one said RE bias-introducing rod.

3. The apparatus of claim 1, wherein each of said plural curved connectors comprises a curved wire that is connected to the respective different one of said linear connectors between the distal ends of said curved wire, the distal ends being spaced apart on a periphery of said conductive member.

4. The apparatus of claim 1, wherein only one of the distal ends of said plural curved connectors is connected to said conductive member.

5. The apparatus of claim 1, wherein only one of the distal ends of each of said plural curved connectors is connected to said conductive member.

6. The apparatus of claim 1, wherein, in plan view, each of said plural linear connectors includes a first straight portion that is connected to said same end of said RE bias-introducing rod and a second straight portion transverse to said first straight portion.

* * * * *